(12) United States Patent
Tani

(10) Patent No.: US 11,094,610 B2
(45) Date of Patent: Aug. 17, 2021

(54) SEMICONDUCTOR POWER MODULE

(71) Applicant: Mitsubishi Electric Corporation, Tokyo (JP)

(72) Inventor: Masakazu Tani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 16/607,177

(22) PCT Filed: May 30, 2017

(86) PCT No.: PCT/JP2017/020124
§ 371 (c)(1),
(2) Date: Oct. 22, 2019

(87) PCT Pub. No.: WO2018/220721
PCT Pub. Date: Dec. 6, 2018

(65) Prior Publication Data
US 2020/0388558 A1     Dec. 10, 2020

(51) Int. Cl.
*H01L 23/473*     (2006.01)
*H01L 23/495*     (2006.01)
(Continued)

(52) U.S. Cl.
CPC ...... *H01L 23/473* (2013.01); *H01L 23/49562* (2013.01); *H01L 23/49568* (2013.01);
(Continued)

(58) Field of Classification Search
None
See application file for complete search history.

(56) References Cited

U.S. PATENT DOCUMENTS

2005/0197799 A1* 9/2005 Kamezawa ........... H02M 7/003
                                                             702/130
2007/0176626 A1* 8/2007 Bayerer ................. H01L 23/34
                                                             702/99
(Continued)

FOREIGN PATENT DOCUMENTS

JP          3194353 B2     7/2001

OTHER PUBLICATIONS

International Search Report for PCT/JP2017/020124 dated Aug. 15, 2017 (PCT/ISA/210) English translation.

*Primary Examiner* — Benjamin P Sandvik
(74) *Attorney, Agent, or Firm* — Sughrue Mion, PLLC; Richard C. Turner

(57) ABSTRACT

Provided is a semiconductor power module including: a first electrode on which a plurality of element arrays each including a plurality of semiconductor elements arranged in an X direction, are arranged in a Y direction; a first main wiring connected to the respective element arrays mounted on the first electrode; a first sensor mounted on a first detection target element as one of the semiconductor elements, which is least influenced by synthetic inductance of the first main wiring among the semiconductor elements of the plurality of element arrays mounted on the first electrode; a first control terminal disposed on the first electrode; and a control board configured to control a current flowing through the first detection target element based on a detection result of the first sensor obtained via the first control terminal.

12 Claims, 13 Drawing Sheets

(51) Int. Cl.
*H01L 23/58* (2006.01)
*H01L 23/00* (2006.01)
*H01L 25/07* (2006.01)
*H02M 7/48* (2007.01)

(52) U.S. Cl.
CPC .............. *H01L 23/58* (2013.01); *H01L 24/45* (2013.01); *H01L 25/07* (2013.01); *H02M 7/48* (2013.01)

(56) References Cited

U.S. PATENT DOCUMENTS

2011/0075451 A1* 3/2011 Bayerer .................. H01L 24/06 363/37
2016/0014916 A1* 1/2016 Ausserlechner ..... H05K 5/0065 361/699

* cited by examiner

SEMICONDUCTOR POWER MODULE

CROSS REFERENCE TO RELATED APPLICATIONS

This application is a National Stage of International Application No. PCT/JP2017/020124 filed May 30, 2017.

TECHNICAL FIELD

The present invention relates to a semiconductor power module configured by a plurality of element arrays each including a plurality of semiconductor elements.

BACKGROUND ART

Hitherto, there has been proposed a temperature detecting device configured to detect a temperature of a semiconductor module configured by a plurality of semiconductor elements (see, for example, Patent Literature 1). The temperature detecting device described in Patent Literature 1 includes temperature detecting diodes provided in respective semiconductor elements and connected to each other in parallel, and a temperature detecting circuit that is connected to the parallel-connected temperature detecting diodes and configured to detect a temperature of a semiconductor module based on output voltage from the parallel-connected temperature detecting diodes.

CITATION LIST

Patent Literature

[PTL 1] JP 3194353 B2

SUMMARY OF INVENTION

Technical Problem

Semiconductor power modules have a configuration in which a temperature sensor and a current sensor are mounted on semiconductor elements to prevent thermal breakdown and overcurrent breakdown of the semiconductor elements. Further, in order to achieve a large-capacity semiconductor power module, semiconductor elements may be formed of a wide bandgap semiconductor, such as silicon carbide or gallium nitride.

However, a wafer substrate made of the wide bandgap semiconductor involves large defect density, and hence, production yield of semiconductor elements is reduced. As a result, upsizing of the respective semiconductor elements becomes difficult Therefore, the semiconductor power module is required to be configured by a plurality of semiconductor elements of a smaller size, which are connected in parallel.

Regarding the related-art device of Patent Literature 1, the device is configured to detect the temperature based on output voltage from the plurality of temperature detecting diodes being connected in parallel and hence, when three temperature detecting diodes are connected in parallel, for example, a temperature detection error becomes 14° C. that is too large a temperature detection error. Therefore, an excessive margin is required for an allowable temperature of the semiconductor power module. Consequently, a power conversion device having mounted thereon the semiconductor power module cannot easily achieve high output.

Further, in the related-art device of Patent Literature 1, it is required to mount the temperature detecting diode to all the semiconductor elements that form the semiconductor module, leading to an increase in manufacturing cost. It is also required to electrically connect the temperature detecting diodes to the temperature detecting circuit. This configuration requires a larger space in which to install connection wirings and therefore, a power conversion device having mounted thereon the semiconductor power module is enlarged.

The present invention has been made to solve the above-mentioned problems, and it is therefore an object of the present invention to achieve a semiconductor power module that can contribute to realization of a high-output and compact power conversion device.

Solution to Problem

According to one embodiment of the present invention, there is provided a semiconductor power module including: a first electrode, on which a plurality of element arrays each including a plurality of semiconductor elements arranged in an X direction, are arranged in a Y direction perpendicular to the X direction; a first main wiring connected to the respective element arrays mounted on the first electrode; a first sensor mounted on a first detection target element as one of the semiconductor elements, which is least influenced by synthetic inductance of the first main wiring among the semiconductor elements of the plurality of element arrays mounted on the first electrode; a first control terminal disposed on the first electrode; and a control board connected to the first sensor via the first control terminal, and configured to control a current flowing through the first detection target element based on a detection result of the first sensor obtained via the first control terminal.

Advantageous Effects of Invention

According to the present invention, the semiconductor power module, which can contribute to realization of the high-output and compact power conversion device, can be provided.

DESCRIPTION OF EMBODIMENTS

Now, a semiconductor power module according to exemplary embodiments of the present invention is described referring to the accompanying drawings. In the illustration of the drawings, the same components or corresponding components are denoted by the same reference symbols, and the overlapping description thereof is herein omitted. Further, the present invention is applied to a power conversion device that is to be mounted to, for example, a plug-in hybrid vehicle and an electric vehicle.

First, a description is given of the power conversion device to which the present invention is applied. The power conversion device includes a switching circuit for power conversion. Specific examples of the power conversion device include a motor driving inverter mounted on an electrically powered vehicle, a step-down converter used to convert high voltage to low voltage, and an electric power component such as a charger connected to an external power supply unit to thereby charge an on-vehicle battery.

Figure 14:
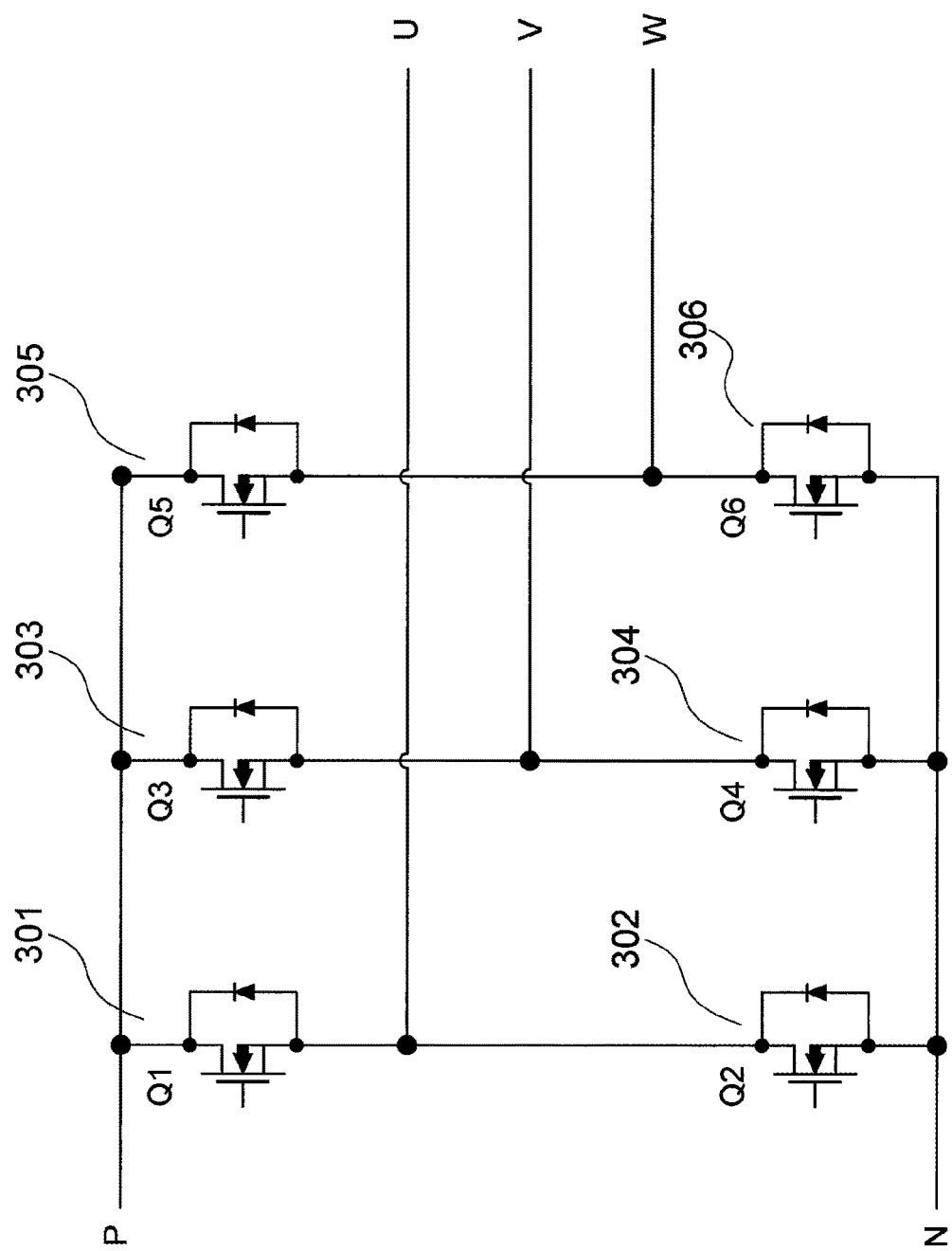
FIG. 14 is a circuit diagram for illustrating an inverter as an example of a power conversion device to which the semiconductor power module according to any one of the first to sixth embodiments of the present invention is applied.

Referring to FIG. 14, a description is given below of the inverter as one example of the power conversion device. FIG. 14 is a circuit diagram for illustrating the inverter as one example of the power conversion device to which a semiconductor power module according to any one of first to sixth embodiments of the present invention is applied.

The inverter of FIG. 14 is configured by semiconductor power modules 301 to 306, and is connected, on its input side, to a DC power supply and connected, on its output side, to a motor having a U-phase winding, a V-phase winding, and a W-phase winding, for example.

The semiconductor power modules 301 to 306 include switching elements Q1 to Q6, respectively. The switching elements Q1, Q3, and Q5 on an upper arm side are connected to a positive side (P side) of the DC power supply, and the switching elements Q2, Q4, and Q6 on a lower arm side are connected to a negative side (N side) of the DC power supply.

The switching elements Q1 and Q2 are provided for a U phase, the switching elements Q3 and Q4 are provided for a V phase, and the switching elements Q5 and Q6 are provided for a W phase.

The respective semiconductor elements mounted on the semiconductor power modules 301 to 306 are, for example, MOS-FETs, IGBTs, or diodes. As a wafer substrate from which to produce the semiconductor elements, wide bandgap semiconductors as well as silicon is used.

The motor driving inverter is required to have a larger capacity along with motorization of vehicles, for example. In order to achieve the inverter of a large capacity, it is conceivable that the wide bandgap semiconductor is used for the wafer substrate and in addition, the size of each semiconductor element is increased. In this case, however, the wafer substrate involves large defect density and hence, production yield of the semiconductor elements is reduced, leading to a high manufacturing cost of the inverter. To address this, the semiconductor elements in each semiconductor power module of the inverter are configured so that a plurality of semiconductor elements having a smaller size are connected in parallel.

First Embodiment

Figure 1:
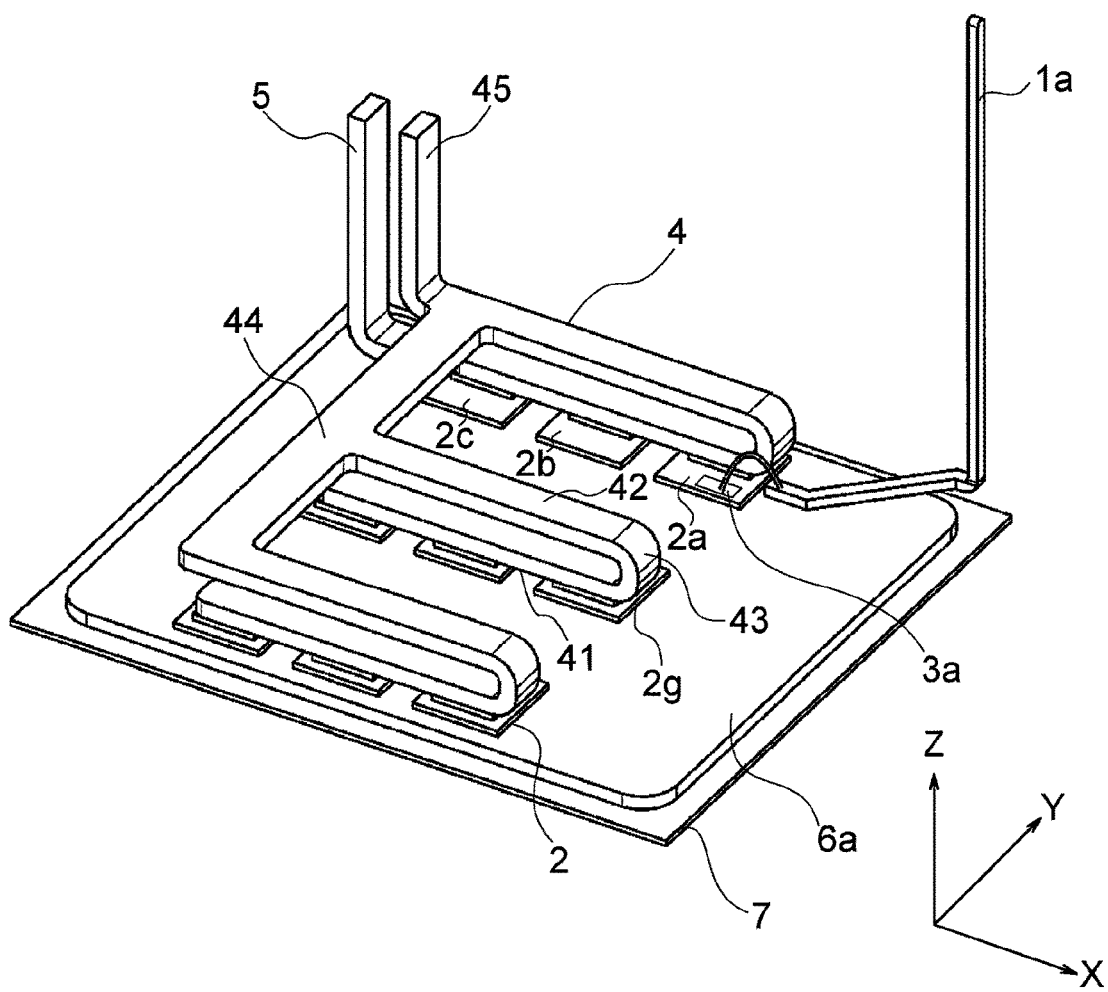
FIG. 1 is a perspective view of a semiconductor power module according to a first embodiment of the present invention.
Figure 2:
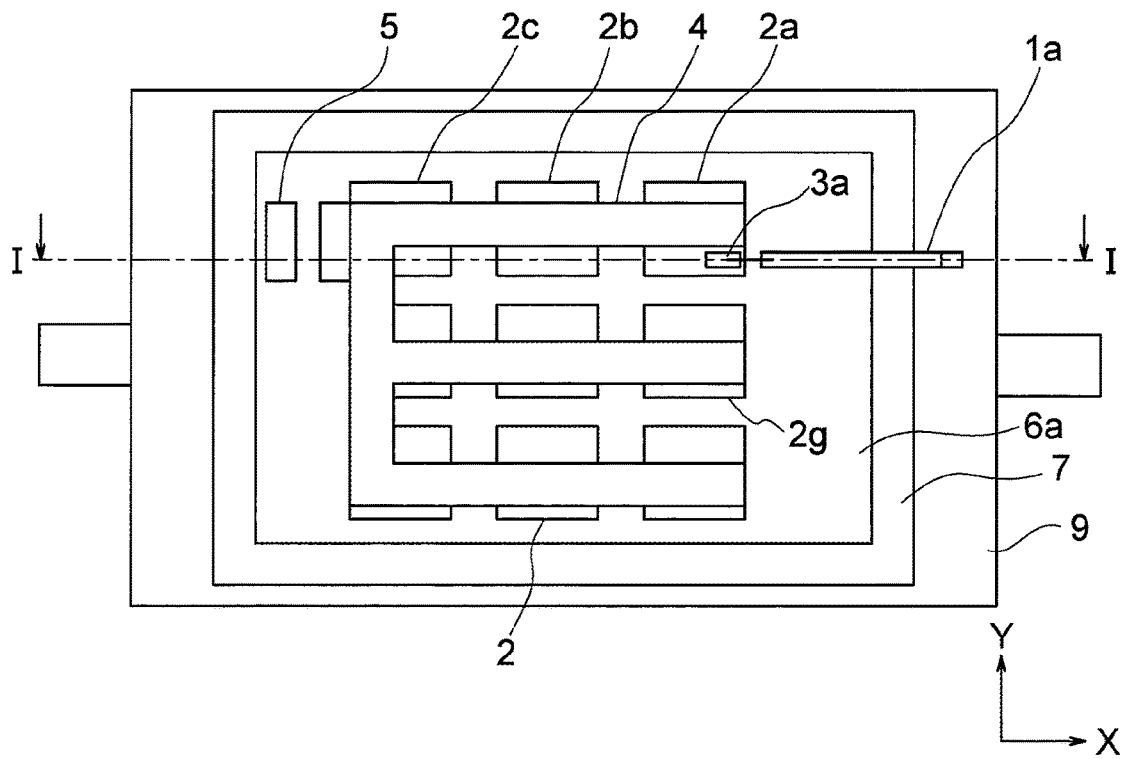
FIG. 2 is a top view of FIG. 1.
Figure 3:
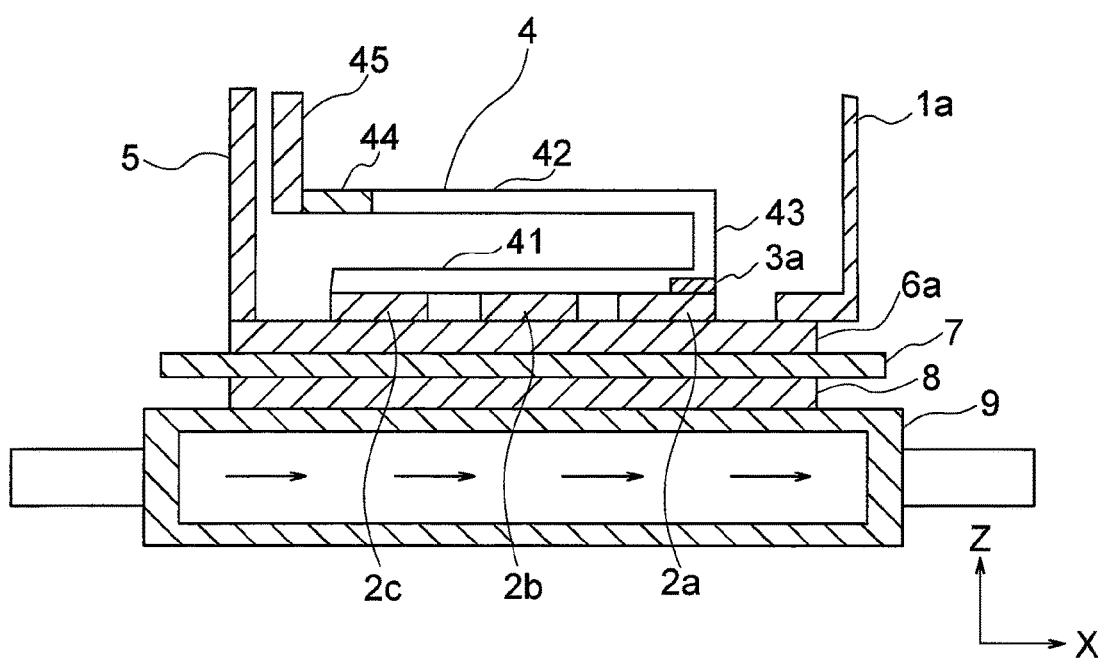
FIG. 3 is a sectional view taken along the line I-I of FIG. 2.

Next, referring to FIG. 1 to FIG. 3, a semiconductor power module of the first embodiment is described. FIG. 1 is a perspective view of the semiconductor power module according to the first embodiment of the present invention. FIG. 2 is a top view of FIG. 1. FIG. 3 is a sectional view taken along the line I-I of FIG. 2. In FIG. 1, a cooler 9 is not illustrated. Further, main wirings described later in the respective embodiments are configured by, for example, copper-made bus bars.

The semiconductor power module of the first embodiment corresponds to the respective semiconductor power modules 301 to 306 of FIG. 14. In other words, the inverter circuit of FIG. 14 can be achieved with use of six semiconductor power modules configured as illustrated in FIG. 1 to FIG. 3.

The semiconductor power module of the first embodiment includes a control terminal 1a, a plurality of semiconductor elements 2, a sensor 3a (first sensor), a main wiring 4 (first main wiring), a main wiring 5, an electrode 6a (first electrode), an insulating substrate 7, a heat sink 8, a cooler 9, and a control board (not shown).

On the electrode 6a to be disposed on the insulating substrate 7, a plurality of element arrays are mounted, which include the plurality of semiconductor elements 2 arranged at regular pitches in an X direction. The element arrays are arranged at regular pitches in a Y direction perpendicular to the X direction. More specifically, the plurality of semiconductor elements 2 are soldered to the electrode 6a that is, for example, a copper pattern. The copper pattern is insulated by the insulating substrate 7. In the first embodiment, three element arrays each including three semiconductor elements 2 are arranged by way of example.

The insulating substrate 7 is mounted, via the heat sink 8, on the cooler 9 used to cool the plurality of semiconductor elements 2. As a cooling system for the cooler 9, there is give, for example, a water-cooling system or an air-cooling system.

The sensor 3a is mounted on a corresponding one (first detection target element) of the semiconductor elements of the plurality of element arrays mounted on the electrode 6a, that is, the first detection target element, which is least influenced by synthetic inductance of the main wiring 4 among those elements. In the first embodiment, the semiconductor element 2 to which the sensor 3a is mounted is referred to as "semiconductor element 2a", the element array including the semiconductor element 2a is referred to as "element array A", and other semiconductor elements 2 in the element array A are referred to as "semiconductor element 2b" and "semiconductor element 2c".

The main wiring 4 is connected to the respective element arrays mounted on the electrode 6a. More specifically, the main wiring 4 is bonded to source pads of the semiconductor elements 2 of the respective element arrays. Control source pads and gate pads of the semiconductor elements 2 are connected to a control terminal (not shown) via an Al wire, for example.

The main wiring 4 has linear portions 41 (first linear portions), linear portions 42 (second linear portions), and connection portions 43. The linear portions 41 extend in the X direction, and are connected to the respective element arrays mounted on the electrode 6a. The linear portions 42 extend, in the X direction, oppositely to the linear portions 41. The connection portions 43 are each formed to connect one end of the respective linear portions 41 and one end of the respective linear portions 42. In the main wiring 4, another ends of the linear portions 42 on the respective element arrays are connected to each other by a connection portion 44 that extends in the Y direction. One end of the connection portion 44 on the element array A side is connected to an end portion 45 extending in a Z direction perpendicular to the X direction and the Y direction. The main wiring 5 is connected to the electrode 6a. The main wiring 5 extends, in the Z direction, oppositely to the end portion 45 of the main wiring 4.

The control terminal 1a is disposed on the electrode 6a at an outer position in the X direction than the plurality of element arrays mounted on the electrode 6a. More specifically, the control terminal 1a extends in the Z direction, and is disposed on the element array A side of the electrode 6a so as to sandwich the element array A with the opposing main wiring 5.

The end portion 45 of the main wiring 4 and an end portion of the main wiring 5 are connected to an electronic device such as a capacitor (PN side), a motor (UVW side), and a semiconductor power module. Referring back to FIG. 14, a description is given below of where the end portion 45 of the main wiring 4 and the end portion of the main wiring 5 are to be connected to, byway of example.

That is, the end portions of the main wirings 5 for the semiconductor power modules 301, 303, and 305 on the upper arm side are all connected to the P side. The end portions 45 of the main wirings 4 for the semiconductor power modules 301, 303, and 305 on the upper arm side are connected to the electrodes 6a of the semiconductor power modules 302, 304, and 306 on the lower arm side, respectively.

The end portions 45 of the main wirings 4 for the semiconductor power modules 301, 303, and 305 on the upper arm side are connected to the U phase, the V phase, and the W phase of the motor, respectively. The end portions of the main wirings 5 for the semiconductor power modules 302, 304, and 306 on the lower arm side are all connected to the N side.

The control board is connected to the sensor 3a via the control terminal 1a, and is configured to control a current to be supplied to the semiconductor element 2a on which the sensor 3a is mounted, based on a detection result of the sensor 3a obtained via the control terminal 1a. The sensor 3a is, for example, a temperature sensor or a current sensor as described later.

Next, the synthetic inductance of the main wiring 4 is described. In the semiconductor element 2 connected to a portion having small synthetic inductance, of the main wiring 4, its source potential changes with no delay as compared with the semiconductor element 2 connected to a portion having large synthetic inductance, of the main wiring 4 and hence, a large amount of current flows therethrough. In general, synthetic inductance of a wiring is defined by a difference between self inductance derived from a wiring length and mutual inductance derived from the effect of a magnetic field caused by wirings close thereto.

At the semiconductor element 2a of the element array A out of the three element arrays, the wiring length from the end portion 45 of the main wiring 4 is shortest, and hence the self-inductance of the main wiring 4 is small. Assuming that the plurality of semiconductor elements 2 are uniformly influenced by the mutual inductance, it is thought that a large amount of current flows in the semiconductor element 2a located at a position with small self inductance, i.e., small synthetic inductance. This is because in the semiconductor element 2a connected to a portion having small synthetic inductance, of the main wiring 4, its source potential changes with no delay as compared with the semiconductor element 2c connected to a portion having large synthetic inductance, of the main wiring 4, and a desired voltage can be applied between a gate and a source and hence, a large amount of current flows therethrough.

As understood from the description above, the semiconductor element 2a is least influenced by the synthetic inductance of the main wiring 4 among the semiconductor elements 2 and hence, the largest amount of current flows therethrough. In other words, the wiring length of the main wiring 4 from the semiconductor element 2a to the end portion 45 is shortest among those from the semiconductor elements of the three element arrays and hence, the semiconductor element 2a is least influenced by the synthetic inductance of the main wiring 4. Consequently, the semiconductor element 2a suffers from the largest conduction loss, and thus is most liable to undergo thermal breakdown.

To address this, the following configuration is adopted in the first embodiment. That is, a temperature sensor is mounted as the sensor 3a on the semiconductor element 2a, and then connected to the control board via the control terminal 1a. The control board is configured to cut off or reduce a current to be supplied to the semiconductor element 2a before a detection value of the temperature sensor exceeds a preset threshold value. This configuration prevents thermal breakdown of the semiconductor element 2a.

Further, in the semiconductor power module, when a control signal for controlling the respective semiconductor elements 2 contains noise so that a large amount of current flows between a drain and a source, thermal breakdown proceeds in the semiconductor element 2a through which the largest amount of current flows.

To address this, the following configuration is adopted in the first embodiment. That is, a current sensor is mounted as the sensor 3a on the semiconductor element 2a, and then connected to the control board via the control terminal 1a. The control board is configured to cut off or reduce a current to be supplied to the semiconductor element 2a before a detection value of the current sensor exceeds a preset threshold value. This configuration prevents short-circuit breakdown of the semiconductor element 2a.

A distance between each linear portion 41 and each linear portion 42 of the main wiring 4 is preferably reduced to a minimum allowable value defined by production constraints so as to reduce synthetic inductance in the respective semiconductor elements 2 that form each element array. In the main wiring 4, a current flows in opposite directions at each linear portion 41 and each linear portion 42. As a result, a magnetic field generated by the current flowing through each linear portion 41 cancels the magnetic field generated by the current flowing through each linear portion 42, to thereby increase the influence of mutual inductance and reduce resultant synthetic inductance. This configuration can suppress a surge voltage during switching operations of the semiconductor elements 2.

A coolant of the cooler 9 is caused to flow in a direction from the semiconductor element 2c that is largely influenced by synthetic inductance of the main wiring 4, to the semiconductor element 2a that is less influenced by the synthetic inductance. Specifically, the semiconductor element 2a to which the sensor 3a is mounted, is located on the most downstream side of the flow of the coolant of the cooler 9 which flows in the X direction. With this arrangement, the coolant increases its temperature by receiving heat from the semiconductor elements 2b and 2c and consequently, shows the highest temperature at a position just below the semiconductor element 2a.

The largest amount of current flows through the semiconductor element 2a to which the temperature sensor as the sensor 3a is mounted, among the semiconductor element 2a to 2c that form the element array A. In addition, the coolant temperature in the cooler 9 is highest at the position just below the semiconductor element 2a. Therefore, it is effective to mount the temperature sensor to the semiconductor element 2a so as to detect the temperature of the semiconductor element 2a.

Further, when at least three or more element arrays are arranged, the temperature of a semiconductor element 2g of an element array other than element arrays at end portions, becomes high due to an influence of thermal interference between the semiconductor elements. Therefore, in this case, it is desirable that the temperature sensor be mounted on the semiconductor element 2g of the element array other than the element arrays at the end portions, so as to detect the temperature of the semiconductor element 2g.

The temperature sensor mounted on the semiconductor element 2a may be provided, for example, in the form of a diode being mounted inside the semiconductor element 2a, in the form of a thermistor being mounted to a source of the semiconductor element 2a, and in the form of a thermistor being mounted onto the electrode 6a at a position close to the semiconductor element 2a. Of those, the form of a diode being mounted inside the semiconductor element 2a is desirable in consideration of the precision of temperature detection.

Here, when the semiconductor elements 2 have variance in threshold value of a gate voltage at which a current flows into the respective semiconductor elements 2, and in conduction resistance value of the semiconductor element 2, the semiconductor element 2 that has a smaller threshold value and a smaller resistance value is placed at a portion having small synthetic inductance, of the main wiring 4. With this arrangement, current deviation is increased.

In the related-art device, as described above, the wafer substrate made of the wide bandgap semiconductor has a large number of defects. Hence, in order to increase production yield of the semiconductor elements 2 and thus achieve cost reduction, the semiconductor elements in each semiconductor power module are required to be configured such that a plurality of semiconductor elements having a small element size are connected in parallel.

However, when the temperature sensors, the current sensors, or other such sensors are mounted to all the plurality of semiconductor elements connected in parallel, such a plurality of sensors are required to be individually connected to a plurality of control terminals via wires, to thereby be connected to the control board. This configuration leads to increases in size of the semiconductor power module including the control board, and in cost thereof.

In contrast, according to the first embodiment, the single sensor 3a is mounted only to the semiconductor element 2a close to the control terminal 1a and hence, the numbers of sensors and control terminals can be reduced, with the result that the semiconductor power module including the control board can be downsized, and a cost thereof can be saved.

Further, the related-art device has a risk in that the synthetic inductance of the main wiring connected to the plurality of semiconductor elements connected in parallel, is increased and the semiconductor elements are broken by resultant surge voltage.

In contrast, according to the first embodiment, the opposing linear portions 41 and linear portions 42 of the main wiring 4 form a two-layer structure as viewed from the Y direction. Such a structure enables a significant decrease in synthetic inductance of the main wiring 4 as compared with a one-layer structure. Accordingly, during high-speed switching operations of the switching elements made of the wide bandgap semiconductor, a serge voltage can be reduced and therefore, highly efficient inverter driving is achieved.

The control terminal 1a is desirably placed as far as possible from the main wiring 4. This arrangement enables reduction in electric noise that may be generated at the control terminal 1a due to the main wiring 4.

As described above, the semiconductor power module according to the first embodiment includes the electrode 6a (first electrode) on which the plurality of element arrays including the plurality of semiconductor elements 2 arranged in the X direction, are arranged in the Y direction, the main wiring 4 (first main wiring) connected to the respective element arrays mounted on the electrode 6a, the sensor 3a (first sensor) mounted to the semiconductor element 2a (first detection target element) out of the semiconductor elements of the plurality of element arrays mounted on the electrode 6a, which is least influenced by the synthetic inductance of the main wiring 4, the control terminal 1a (first control terminal) disposed on the electrode 6a, and the control board configured to control a current to be supplied to the semiconductor element 2a based on a detection result of the sensor 3a obtained via the control terminal 1a.

With this configuration, the temperature of the semiconductor element can be detected with use of the single sensor and hence, a temperature detection error can be further reduced. Therefore, a margin of an allowable temperature of the semiconductor power module can be reduced and consequently, a high-output power conversion device can be achieved.

Further, it is not required to mount the sensor on all semiconductor elements of the semiconductor power module and hence, for example, an area required to mount the sensor can be reduced, and a cost can be accordingly saved. Moreover, it is only required to connect the single sensor to the control board and hence, a space in which a connection wiring is installed can be reduced, and the power conversion device can be accordingly downsized. Further, with the configuration in which the temperature sensor or the current sensor is mounted as the sensor to the semiconductor element that receives the largest amount of current and suffers from the largest thermal damage among the plurality of semiconductor elements that form the semiconductor power module, the single sensor suffices to protect the semiconductor elements from an excessive temperature rise or overcurrent.

As apparent from the description above, the semiconductor power module according to the first embodiment contributes to realization of a high-output conversion device and the downsizing of the power conversion device.

Second Embodiment

Figure 4:
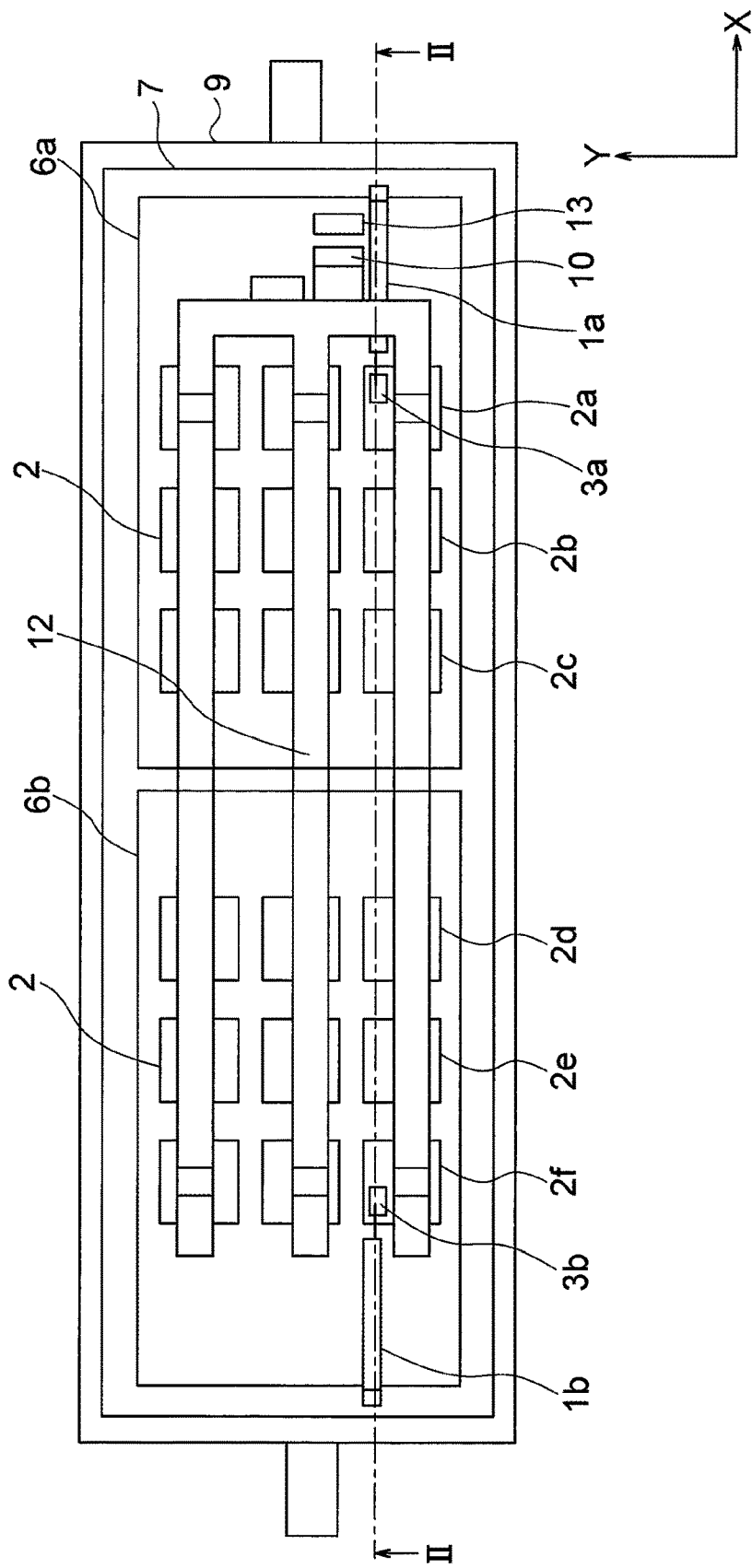
FIG. 4 is a top view of a semiconductor power module according to a second embodiment of the present invention.
Figure 5:
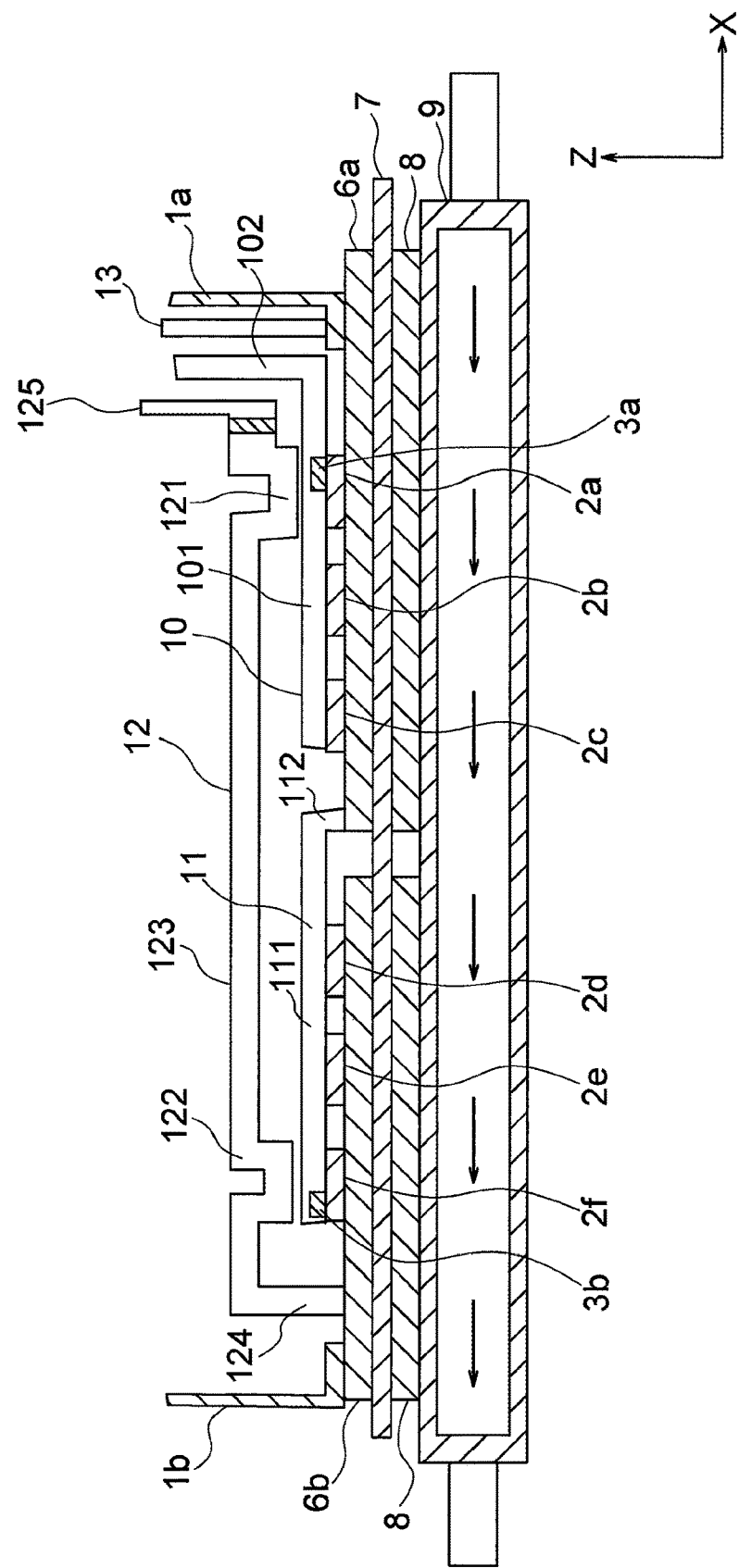
FIG. 5 is a sectional view taken along the line II-II of FIG. 4.

Referring to FIG. 4 and FIG. 5, a description is given of a semiconductor power module according to a second embodiment of the present invention, which has a different configuration from that in the first embodiment. FIG. 4 is a top view of the semiconductor power module according to the second embodiment of the present invention. FIG. 5 is a sectional view taken along the line II-II of FIG. 4. In the second embodiment, the description is not given of similar configuration to that in the first embodiment, and is mainly given of the different configuration from the first embodiment.

The semiconductor power module of the second embodiment corresponds to each of three different sets of the semiconductor power modules 301, 303, and 305 on the upper arm side and the semiconductor power modules 302, 304, and 306 on the lower arm side as illustrated in FIG. 14. In other words, the inverter circuit of FIG. 14 can be achieved with use of three semiconductor power modules configured as illustrated in FIG. 4 and FIG. 5.

The semiconductor power module of the second embodiment includes the control terminal 1a (first control terminal), a control terminal 1b (second control terminal), the plurality of semiconductor elements 2, the sensor 3a (first sensor), a sensor 3b (second sensor), the main wiring 10 (first main wiring), a main wiring 11 (second main wiring), a main wiring 12 (third main wiring), a main wiring 13, the electrode 6a (first electrode), an electrode 6b (second electrode), the insulating substrate 7, two heat sinks 8, the cooler 9, and the control board (not shown).

On the electrode 6a to be disposed on the insulating substrate 7, a plurality of element arrays are mounted, which include the plurality of semiconductor elements 2 arranged at regular pitches in the X direction. The element arrays are arranged at regular pitches in the Y direction. Likewise, on the electrode 6b to be disposed on the insulating substrate 7, a plurality of element arrays are mounted, which include the plurality of semiconductor elements 2 arranged at regular pitches in the X direction. The element arrays are arranged at regular pitches in the Y direction. In this way, on the insulating substrate 7, the electrode 6a and the electrode 6b are separately mounted, and the plurality of semiconductor elements 2 are mounted on both of the electrode 6a and the electrode 6b.

The sensor 3a is mounted on a corresponding one (first detection target element) of the semiconductor elements of the plurality of element arrays mounted on the electrode 6a, that is, the first detection target element is least influenced by the synthetic inductance of the main wiring 10 among those elements. In the second embodiment, the semiconductor element 2 to which the sensor 3a is mounted is referred to as "semiconductor element 2a", the element array including the semiconductor element 2a is referred to as "element array A", and other semiconductor elements 2 of the element array A are referred to as "semiconductor element 2b" and "semiconductor element 2c".

The sensor 3b is mounted on a corresponding one (second detection target element) of the semiconductor elements of the plurality of element arrays mounted on the electrode 6b, that is, the first detection target element is least influenced by synthetic inductance of the main wiring 11 among those elements. In the second embodiment, the semiconductor element 2 to which the sensor 3b is mounted is referred to as "semiconductor element 2f", the element array including the semiconductor element 2f is referred to as "element array B", and other semiconductor elements 2 in the element array B are referred to as "semiconductor element 2d" and "semiconductor element "2e".

The main wiring 10 is connected to the respective element arrays mounted on the electrode 6a. More specifically, the main wiring 10 is bonded to source pads of the semiconductor elements 2 of the respective element arrays mounted on the electrode 6a.

The main wiring 10 has linear portions 101 that extend in the X direction and are connected to the respective element arrays mounted on the electrode 6a. An end portion 102 of the main wiring 10 extends in the Z direction and is connected to an electronic device (e.g., a capacitor). Considering the configuration of FIG. 14, for example, the end portion 102 of the main wiring 10 is connected to the N side.

The main wiring 11 is connected to the respective element arrays mounted on the electrode 6b. More specifically, the main wiring 11 is bonded to source pads of the semiconductor elements 2 of the respective element arrays mounted on the electrode 6b.

The main wiring 11 has linear portions 111 that extend in the X direction. An end portion 112 of the main wiring 11 extends in the Z direction and is connected to the electrode 6a.

The main wiring 12 has a recess 121 (first recess) formed oppositely above the semiconductor element 2 located at an outermost position in the X direction among the semiconductor elements 2 of the respective element arrays mounted on the electrode 6a, a recess 122 (second recess) formed oppositely above the semiconductor element 2 located at an innermost position in the X direction among the semiconductor elements 2 of the respective element arrays mounted on the electrode 6b, and a linear portion 123 formed to connect one end of the recess 121 and one end of the recess 122 and extend, in the X direction, oppositely to a corresponding one of the linear portions 101 and a corresponding one of the linear portions 111. One end 124 of the main wiring 12 extends in the Z direction and is connected to the electrode 6b. Another end 125 of the main wiring 12 is connected to an electronic device. Considering the configuration of FIG. 14, for example, the end portion 125 of the main wiring 12 is connected to the P side.

A distance between the recess 121 and a corresponding one of the linear portions 101 is smaller than that between the linear portion 123 and a corresponding one of the linear portions 101. Further, a distance between the recess 122 and a corresponding one of the linear portions 111 is smaller than that between the linear portion 123 and a corresponding one of the linear portions 111. The main wiring 13 is connected to the electrode 6a and extends in the Z direction. Considering the configuration of FIG. 14, for example, the end portion of the main wiring 13 is connected to the UVW side.

The control terminal 1a is disposed on the electrode 6a at an outer position in the X direction than the plurality of element arrays mounted on the electrode 6a, and extends in the Z direction. The control terminal 1b is disposed on the electrode 6b at an inner position in the X direction than the plurality of element arrays mounted on the electrode 6b, and extends in the Z direction.

The control board is connected to the sensor 3a via the control terminal 1a, and configured to control a current flowing through the semiconductor element 2a to which the sensor 3a is mounted, based on a detection result of the sensor 3a obtained via the control terminal 1a. Further, the control board is connected to the sensor 3b via the control terminal 1b, and configured to control a current flowing through the semiconductor element 2f to which the sensor 3b is mounted, based on a detection result of the sensor 3b obtained via the control terminal 1b. Similarly to the first embodiment, the sensors 3a and 3b are temperature sensors or current sensors.

Next, synthetic inductance of the main wiring 10 and synthetic inductance of the main wiring 11 are described.

Regarding the synthetic inductance of the main wiring 10 that influences the semiconductor element 2a, the influence of mutual inductance is large at a position corresponding to the semiconductor element 2a because the main wiring 10 and the main wiring 12 formed just above the main wiring 10 are close to each other at that position. Therefore, the semiconductor element 2a is less susceptible to the synthetic inductance of the main wiring 10 than other semiconductor elements 2 mounted on the electrode 6a.

Similarly, regarding the synthetic inductance of the main wiring 11 that influences the semiconductor element 2f, the influence of mutual inductance is large at a position corresponding to the semiconductor element 2f because the main wiring 11 and the main wiring 12 formed just above the main wiring 11 are close to each other at that position. Therefore, the semiconductor element 2f is less susceptible to the synthetic inductance of the main wiring 11 than other semiconductor elements 2 mounted on the electrode 6b.

Accordingly, the semiconductor element 2a is least influenced by the synthetic inductance of the main wiring 10 among the semiconductor elements 2 mounted on the electrode 6a and hence, the largest amount of current flows therethrough. Likewise, the semiconductor element 2f is least influenced by the synthetic inductance of the main wiring 11 among the semiconductor elements 2 mounted on the electrode 6b and hence, the largest amount of current flows therethrough.

Hence, in the second embodiment, temperature sensors or the current sensors are mounted as the sensors 3a and 3b to the semiconductor elements 2a and 2f, respectively, and configured to cut off or reduce a current to be supplied to the semiconductor elements 2a and 2f before a detection value of each sensor exceeds a preset threshold value.

The current sensor is desirably mounted on both the semiconductor elements 2a and 2f that receive the largest amount of current as described above. Further, the temperature sensor is desirably mounted on the semiconductor element 2f disposed on the most downstream side of the flow of the coolant in the cooler 9, which flows in the X direction.

As described above, in contrast to the configuration of the first embodiment, the semiconductor module according to the second embodiment further includes the electrode 6b (second electrode) on which the plurality of element arrays including the plurality of semiconductor elements 2 arranged in the X direction, are arranged in the Y direction, the main wiring 11 (second main wiring) connected to the respective element arrays mounted on the electrode 6b, the sensor 3b (second sensor) mounted to the semiconductor element 2f (second detection target element) out of the semiconductor elements of the plurality of element arrays mounted on the electrode 6b, which is least influenced by the inductance of the main wiring 11, and the control terminal 1b (second control terminal) disposed on the electrode 6b.

Further, in the above-mentioned configuration, the control board is configured to further control a current flowing through the semiconductor element 2f based on the detection result of the sensor 3b obtained via the control terminal 1b. This configuration can produce the same effects as those of the first embodiment as well.

Third Embodiment

Figure 6:
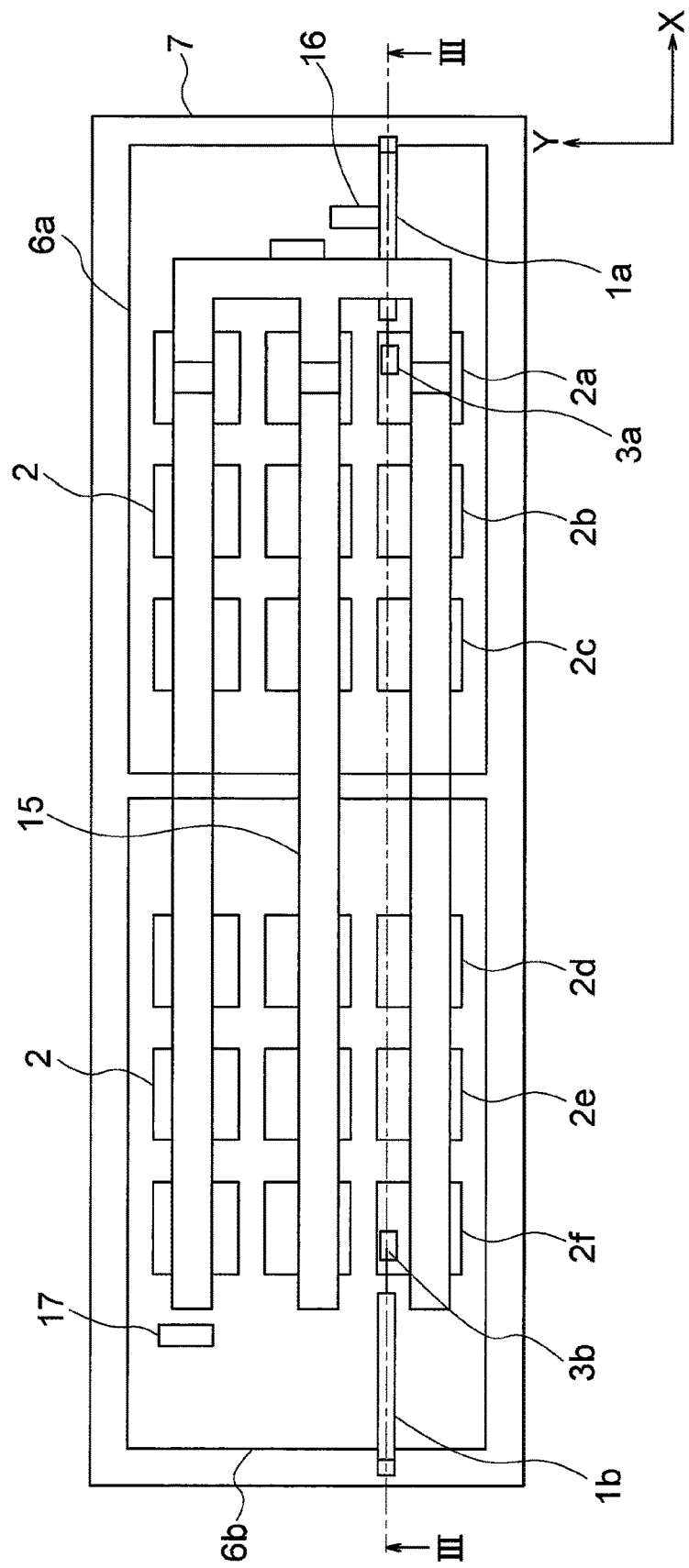
FIG. 6 is a top view of a semiconductor power module according to a third embodiment of the present invention.
Figure 7:
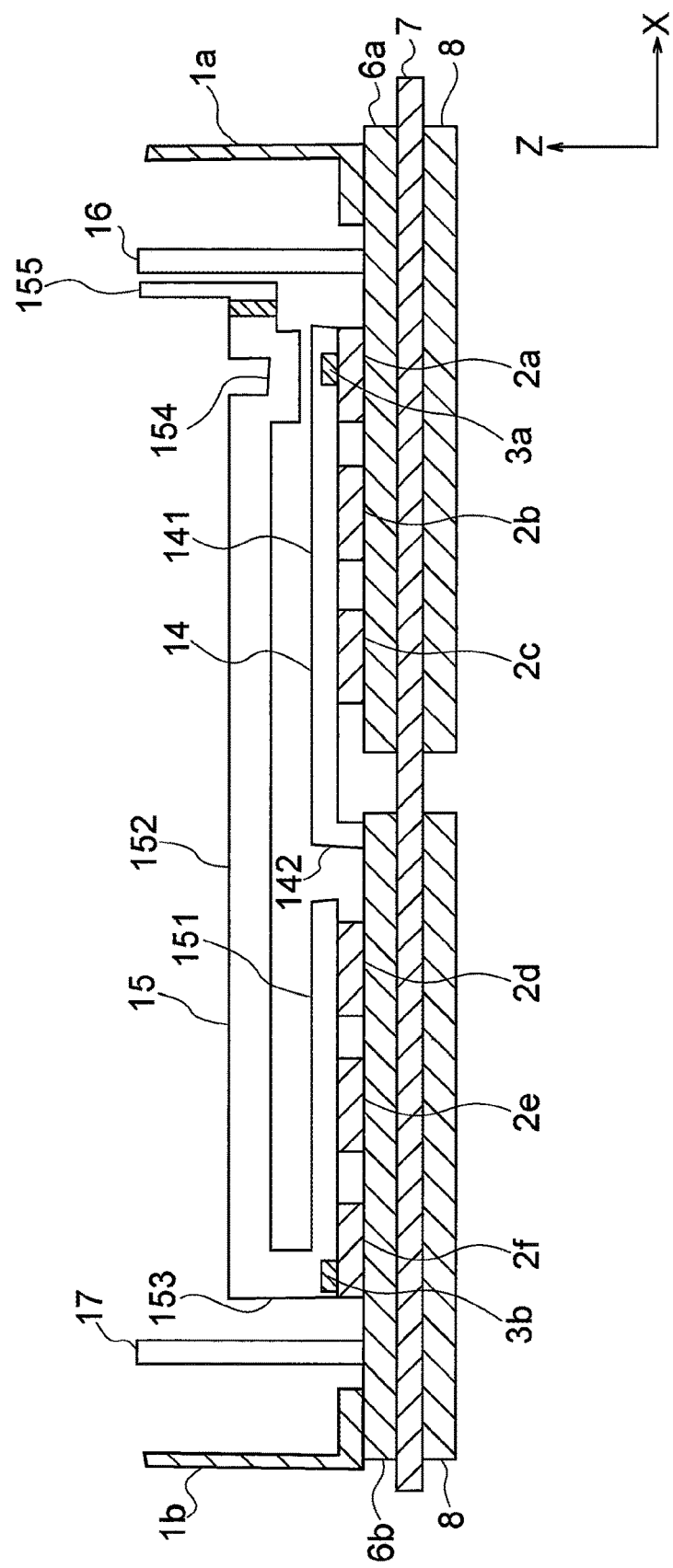
FIG. 7 is a sectional view taken along the line III-III of FIG. 6.

Referring to FIG. 6 and FIG. 7, a description is given of a semiconductor power module according to a third embodiment of the present invention, which has a different configuration from that in the second embodiment. FIG. 6 is a top view of the semiconductor power module according to the third embodiment of the present invention. FIG. 7 is a sectional view taken along the line of FIG. 6. In the third embodiment, the description is not given of similar configuration to that in the first embodiment and the second embodiment, and is mainly given of the different configuration from the first embodiment and the second embodiment.

The semiconductor power module of the third embodiment includes the control terminal 1a (first control terminal), the control terminal 1b (second control terminal), the plurality of semiconductor elements 2, the sensor 3a (first sensor), the sensor 3b (second sensor), the main wiring 14 (first main wiring), the main wiring 15 (second main wiring), a main wiring 16, a main wiring 17, the electrode 6a (first electrode), the electrode 6b (second electrode), the insulating substrate 7, the two heat sinks, the cooler 9 (not shown), and the control board (not shown).

Similarly to the second embodiment, on the insulating substrate 7, the electrode 6a and the electrode 6b are separately mounted, and the plurality of semiconductor elements 2 are mounted on both of the electrode 6a and the electrode 6b.

The main wiring 14 is connected to the respective element arrays mounted on the electrode 6a. More specifically, the main wiring 14 is bonded to source pads of the semiconductor elements 2 of the respective element arrays mounted on the electrode 6a.

The main wiring 14 has linear portions 141 that extend in the X direction and are connected to the respective element arrays mounted on the electrode 6a. An end portion 142 of the main wiring 14 extends in the Z direction and is connected to the electrode 6b.

The main wiring 15 is connected to the respective element arrays mounted on the electrode 6b. More specifically, the main wiring 15 is bonded to source pads of the semiconductor elements 2 of the respective element arrays mounted on the electrode 6b.

The main wiring 15 has linear portions 151 (first linear portions) that are connected to the respective element arrays mounted on the electrode 6b, and extend in the X direction, linear portions 152 (second linear portions) extending, in the X direction, oppositely to the linear portions 151 and the linear portions 141, connection portions 153 formed to connect one ends of the respective linear portions 151 and one ends of the respective linear portions 152, and a recess 154 connected to another end of a corresponding one of the linear portions 152 and formed oppositely above the semiconductor element 2 located at the outermost position in the X direction among the semiconductor elements of the respective element arrays mounted on the electrode 6a. An end portion 155 of the main wiring 15 is connected to an electronic device. Considering the configuration of FIG. 14, for example, the end portion 155 of the main wiring 15 is connected to the N side.

A distance between the recess 154 and a corresponding one of the linear portions 141 is smaller than that between a corresponding one of the linear portions 152 and a corresponding one of the linear portions 141.

The main wiring 16 is connected to the electrode 6a, and extends in the Z direction, and the main wiring 17 is connected to the electrode 6b, and extends in the Z direction. An end portion of the main wiring 16 is connected to an electronic device. Considering the configuration of FIG. 14, for example, the end portion of the main wiring 17 is connected to the UVW side, and the end portion of the main wiring 16 is connected to the P side.

Next, synthetic inductance of the main wiring 14 and synthetic inductance of the main wiring 15 are described.

The wiring length from the end portion 155 of the main wiring 15 to the semiconductor element 2f is shortest of the plurality of semiconductor elements 2 mounted on the electrode 6b and hence, the self inductance of the main wiring 15 is small at the semiconductor element 2f. Accordingly, the semiconductor element 2f receives the largest amount of current and suffers from the largest conduction loss among the plurality of semiconductor elements 2 mounted on the electrode 6b.

Meanwhile, the main wiring 14 and the main wiring 15 formed just above the main wiring 14 are close to each other at the semiconductor element 2a among the plurality of semiconductor elements 2 mounted on the electrode 6a. Therefore, the synthetic inductance of the main wiring 14 is small at the semiconductor element 2a compared with other semiconductor elements 2 mounted on the electrode 6a. Accordingly, the semiconductor element 2a receives the largest amount of current and suffers from the largest conduction loss among the plurality of semiconductor elements 2 mounted on the electrode 6a.

Hence, in the third embodiment, temperature sensors or the current sensors are mounted as the sensors 3a and 3b to the semiconductor elements 2a and 2f, respectively, and configured to cut off or reduce a current to be supplied to the semiconductor elements 2a and 2f before a detection value of each sensor exceeds a preset threshold value.

As described above, in the semiconductor module of the third embodiment, the main wiring 14 and the main wiring 15 are configured in a different way from the configuration of the second embodiment. That is, the main wiring 14 (first main wiring) is configured to have the linear portions 141 that are connected to the respective element arrays mounted on the electrode 6a (first electrode), and extend in the X direction. The main wiring 15 (second main wiring) is configured to have the linear portions 151 (first linear portions) that are connected to the respective element arrays mounted to the electrode 6b (second electrode), and extend in the X direction, the linear portions 152 (second linear portions) extending, in the X direction, oppositely to the linear portions 151 and the linear portions 141, the connection portions 153 formed to connect one ends of the respective linear portions 151 and one ends of the respective linear portions 152, and the recess 154 connected to another end of a corresponding one of the linear portions 152, and formed oppositely above the semiconductor element 2a (first detection target element) mounted on the electrode 6a. This configuration can produce the same effects as those of the first embodiment as well.

Fourth Embodiment

Figure 8:
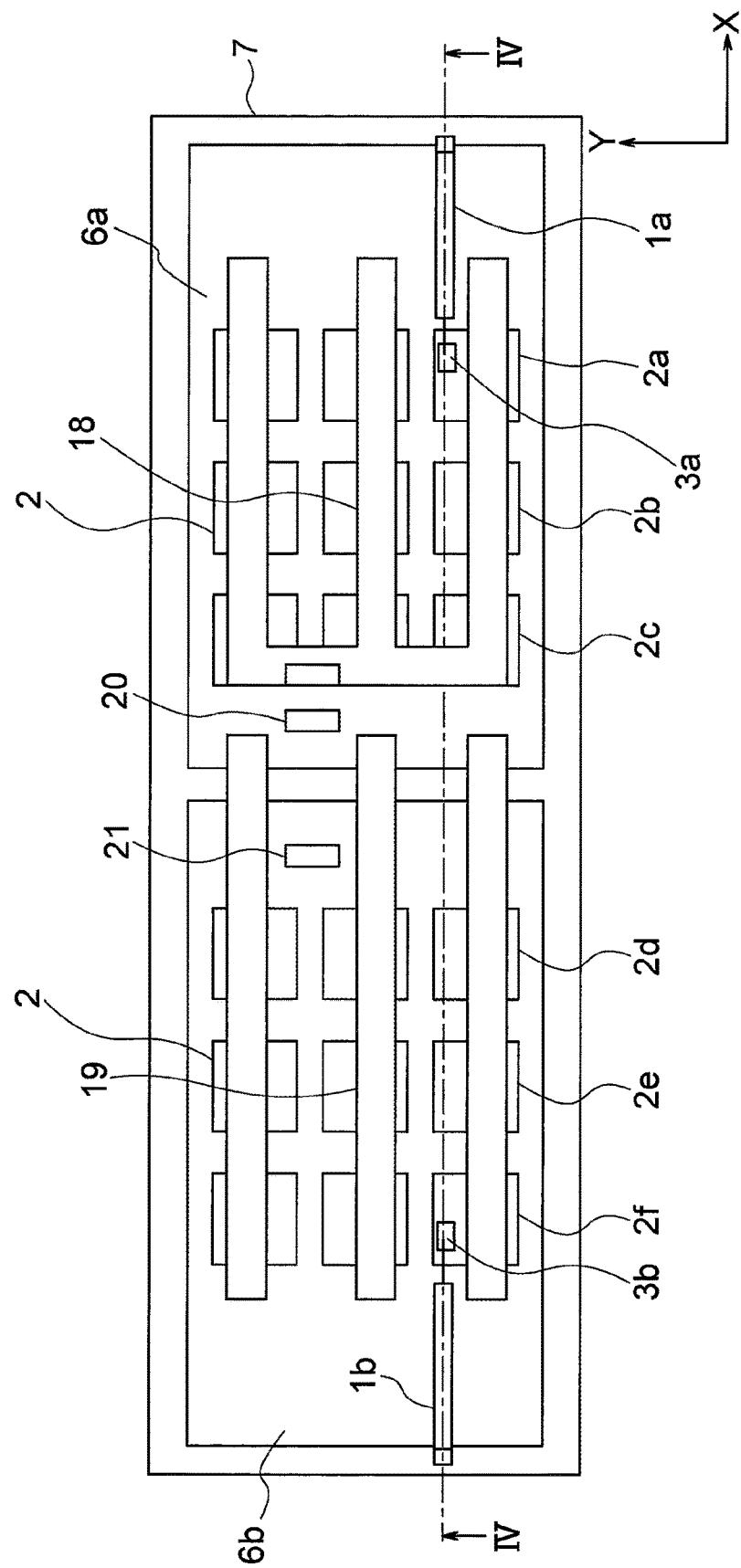
FIG. 8 is a top view of a semiconductor power module according to a fourth embodiment of the present invention.
Figure 9:
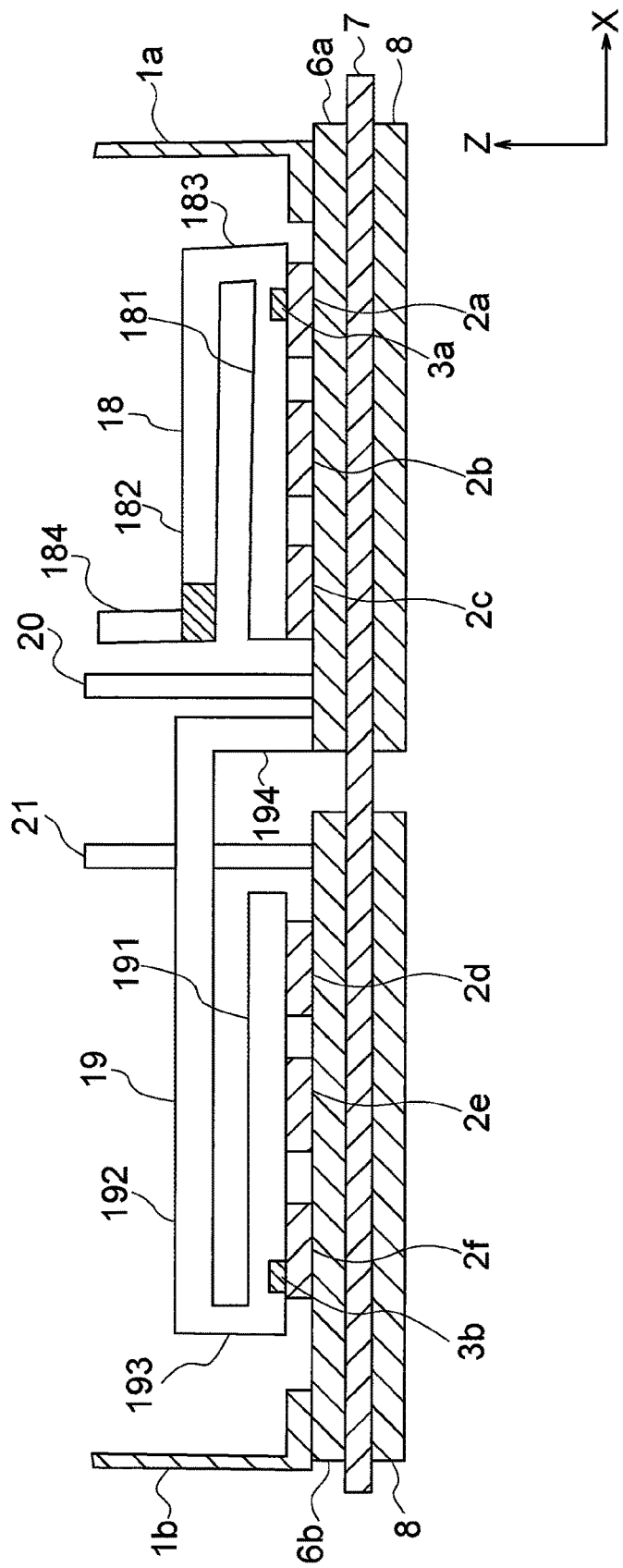
FIG. 9 is a sectional view taken along the line IV-IV of FIG. 8.

Referring to FIG. 8 and FIG. 9, a description is given of a semiconductor power module according to a fourth embodiment of the present invention, which has a different configuration from that in the first embodiment and the second embodiment. FIG. 8 is a top view of the semiconductor power module according to the fourth embodiment of the present invention. FIG. 9 is a sectional view taken along the line IV-IV of FIG. 8. In the fourth embodiment, the description is not given of similar configuration to that in the first embodiment to third embodiment, and is mainly given of the different configuration from the first embodiment to third embodiment.

The semiconductor power module of the fourth embodiment includes the control terminal 1a (first control terminal), the control terminal 1b (second control terminal), the plurality of semiconductor elements 2, the sensor 3a (first sensor), the sensor 3b (second sensor), the main wiring 18 (first main wiring), a main wiring 19 (second main wiring), a main wiring 20, a main wiring 21, the electrode 6a (first electrode), the electrode 6b (second electrode), the insulating substrate 7, the two heat sinks 8, the cooler 9 (not shown), and the control board (not shown).

Similarly to the second embodiment, on the insulating substrate 7, the electrode 6a and the electrode 6b are separately mounted, and the plurality of semiconductor elements 2 are mounted on both of the electrode 6a and the electrode 6b.

The main wiring 18 is connected to the respective element arrays mounted on the electrode 6a. More specifically, the main wiring 18 is bonded to source pads of the semiconductor elements 2 of the respective element arrays mounted on the electrode 6a.

The main wiring 18 has linear portions 181 (first linear portions) that are connected to the respective element arrays mounted on the electrode 6a, and extend in the X direction, linear portions 182 (second linear portions) extending, in the X direction, oppositely to the linear portions 181, and connection portions 183 formed to connect one ends of the respective linear portions 181 and one ends of the respective linear portions 182. An end portion 184 of the main wiring 18 is connected to an electronic device. Considering the configuration of FIG. 14, for example, the end portion 184 of the main wiring 18 is connected to the N side.

The main wiring 19 is connected to the respective element arrays mounted on the electrode 6b. More specifically, the main wiring 19 is bonded to source pads of the semiconductor elements 2 of the respective element arrays mounted on the electrode 6b.

The main wiring 19 has linear portions 191 (first linear portions) that are connected to the respective element arrays mounted on the electrode 6b, and extend in the X direction, linear portions 192 (second linear portions) extending, in the X direction, oppositely to the linear portions 191, connection portions 193 formed to connect one ends of the respective linear portions 191 and one ends of the respective linear portions 192. An end portion 194 of the main wiring 19 extends in the Z direction, and is connected to the electrode 6a.

The main wiring 20 is connected to the electrode 6a, and extends in the Z direction, and an end portion thereof is connected to an electronic device. The main wiring 21 is connected to the electrode 6b, and extends in the Z direction, and an end portion thereof is connected to an electronic device. Considering the configuration of FIG. 14, for example, the end portion of the main wiring 20 is connected to the UVW side, and the end portion of the main wiring 21 is connected to the P side.

As described above, in the semiconductor module of the fourth embodiment, the main wiring 18 and the main wiring 19 are formed in a different way from the configuration of the second embodiment. That is, the main wiring 18 (first main wiring) is configured to have the linear portions 181 (first linear portions) that are connected to the respective element arrays mounted on the electrode 6a (first electrode), and extend in the X direction, the linear portions 182 (second linear portions) extending, in the X direction, oppositely to the linear portions 181, and the connection portions 183 formed to connect one ends of the respective linear portions 181 and one ends of the respective linear portions 182. The main wiring 19 (second main wiring) is configured to have the linear portions 191 (first linear portions) that are connected to the respective element arrays mounted to the electrode 6b (second electrode), and extend in the X direction, the linear portions 192 (second linear portions) extending, in the X direction, oppositely to the linear portions 191, and the connection portions 193 formed to connect one ends of the respective linear portions 191 and one ends of the respective linear portions 192. This configuration can produce the same effects as those of the first embodiment as well.

Fifth Embodiment

Figure 10:
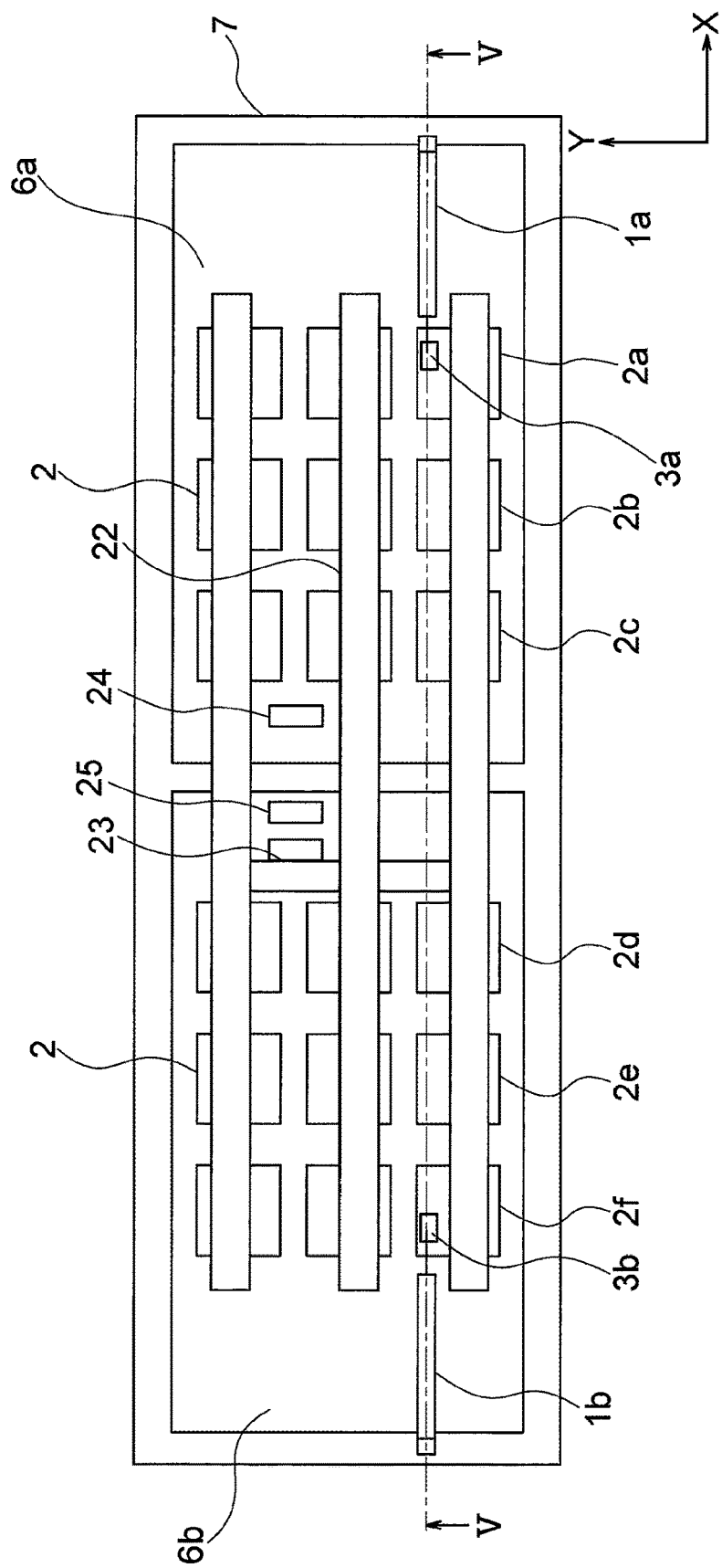
FIG. 10 is a top view of a semiconductor power module according to a fifth embodiment of the present invention.
Figure 11:
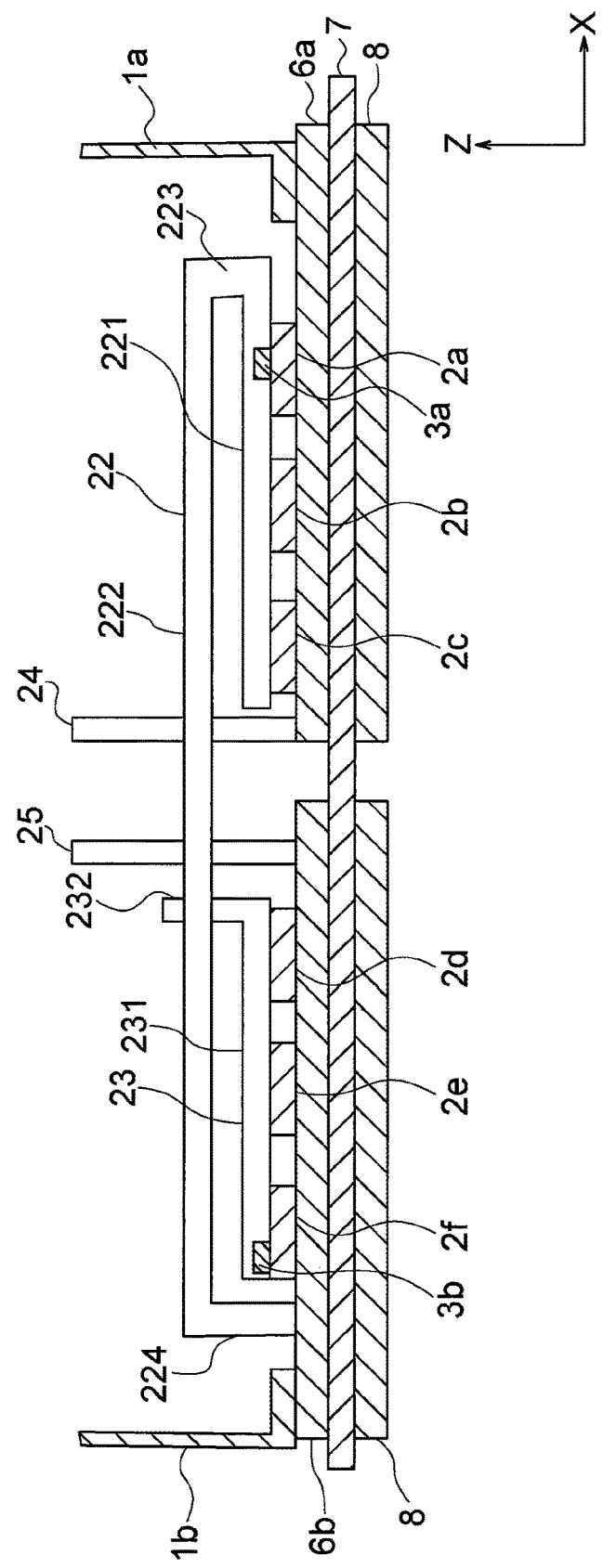
FIG. 11 is a sectional view taken along the line V-V of FIG. 10.

Referring to FIG. 10 and FIG. 11, a description is given of a semiconductor power module according to a fifth embodiment of the present invention, which has a different configuration from that in the second embodiment to fourth embodiment. FIG. 10 is a top view of the semiconductor power module according to the fifth embodiment of the present invention. FIG. 11 is a sectional view taken along the line V-V of FIG. 10. In the fifth embodiment, the description is not given of similar configuration to that in the first embodiment to fourth embodiment, and is mainly given of the different configuration from the first embodiment to fourth embodiment.

The semiconductor power module of the fifth embodiment includes the control terminal 1a (first control terminal), the control terminal 1b (second control terminal), the plurality of semiconductor elements 2, the sensor 3a (first sensor), the sensor 3b (second sensor), the main wiring 22 (first main wiring), a main wiring 23 (second main wiring), a main wiring 24, a main wiring 25, the electrode 6a (first electrode), the electrode 6b (second electrode), the insulating substrate 7, the two heat sinks 8, the cooler 9 (not shown), and the control board (not shown).

Similarly to the second embodiment, on the insulating substrate 7, the electrode 6a and the electrode 6b are separately mounted, and the plurality of semiconductor elements 2 are mounted on both of the electrode 6a and the electrode 6b.

The main wiring 22 is connected to the respective element arrays mounted on the electrode 6a. More specifically, the main wiring 22 is bonded to source pads of the semiconductor elements 2 of the respective element arrays mounted on the electrode 6a.

The main wiring 22 has linear portions 221 (first linear portions) that are connected to the respective element arrays mounted on the electrode 6a, and extend in the X direction, linear portions 222 (second linear portions) extending, in the X direction, oppositely to linear portions 231 described later and the linear portions 221, and connection portions 223 formed to connect one ends of the respective linear portions 221 and one ends of the respective linear portions 222. An end portion 224 of the main wiring 22 extends in the Z direction, and is connected to the electrode 6b.

The main wiring 23 is connected to the respective element arrays mounted on the electrode 6b. More specifically, the main wiring 23 is bonded to source pads of the semiconductor elements 2 of the respective element arrays mounted on the electrode 6b.

The main wiring 23 has the linear portions 231 that are connected to the respective element arrays mounted on the electrode 6b, and extend in the X direction. An end portion 232 of the main wiring 23 extends in the Z direction, and is connected to a first electronic device. Considering the configuration of FIG. 14, for example, the end portion 232 of the main wiring 23 is connected to the N side.

The main wiring 24 is connected to the electrode 6a, and extends in the Z direction, and an end portion thereof is connected to a first electronic device. The main wiring 25 is connected to the electrode 6b, and extends in the Z direction, and the end portion thereof is connected to a second electronic device. Considering the configuration of FIG. 14, for example, the end portion of the main wiring 25 is connected to the UVW side, and the end portion of the main wiring 24 is connected to the P side.

As described above, in the semiconductor power module of the fifth embodiment, the main wiring 22 and the main wiring 23 are formed in a different way from the configuration of the second embodiment. That is, the main wiring 23 (second main wiring) is configured to have the linear portions 231 that are connected to the respective element arrays mounted on the electrode 6b (second electrode), and extend in the X direction. The main wiring 22 (first main wiring) is configured to have the linear portions 221 (first linear portions) that are connected to the respective element arrays mounted to the electrode 6a (first electrode), and extend in the X direction, the linear portions 222 (second linear portions) extending, in the X direction, oppositely to the linear portions 231 and the linear portions 221, and the connection portions 223 formed to connect one ends of the respective linear portions 221 and one ends of the respective linear portions 222. This configuration can produce the same effects as those of the first embodiment as well.

Sixth Embodiment

Figure 12:
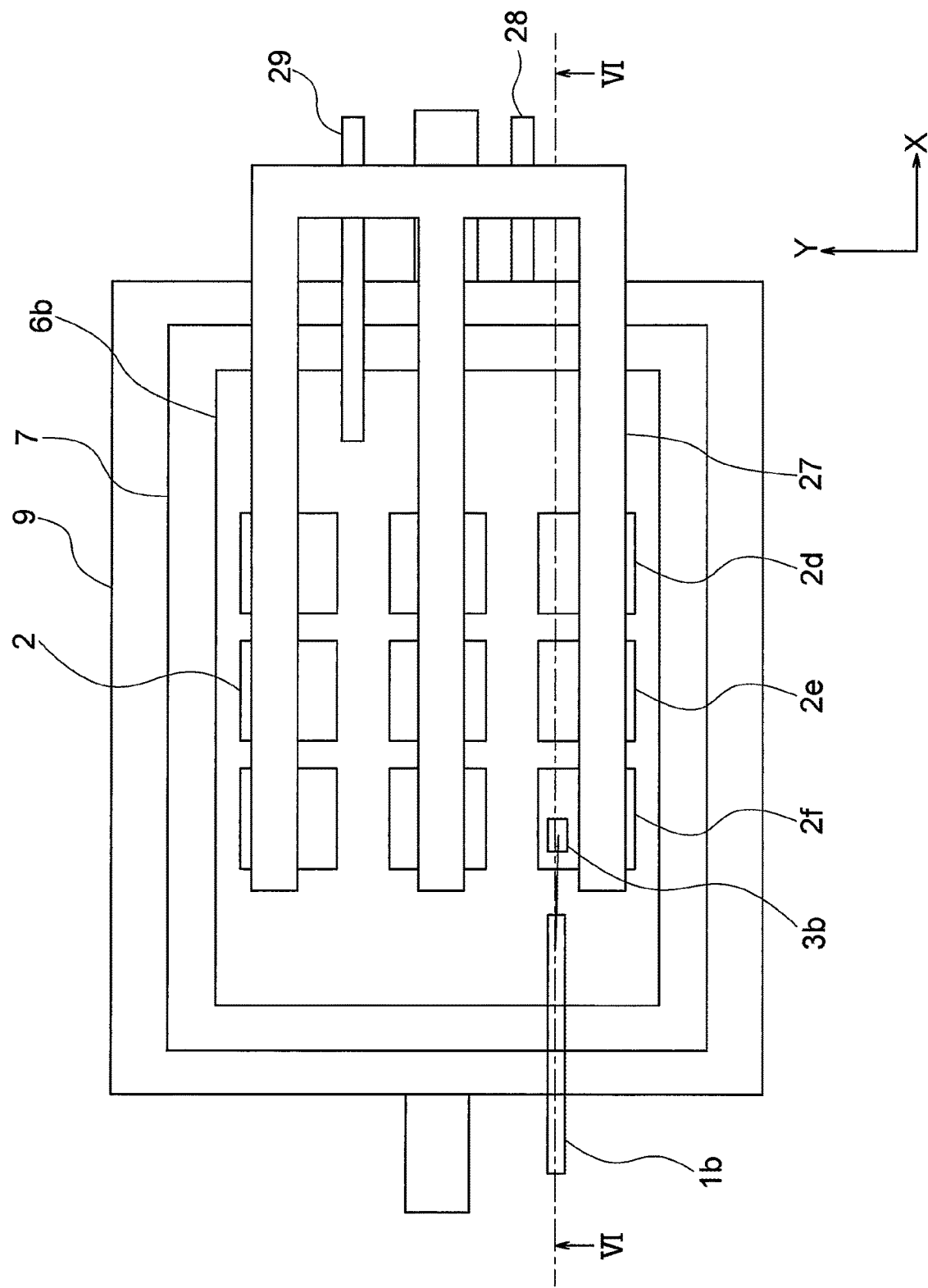
FIG. 12 is a bottom view of a semiconductor power module according to a sixth embodiment of the present invention.
Figure 13:
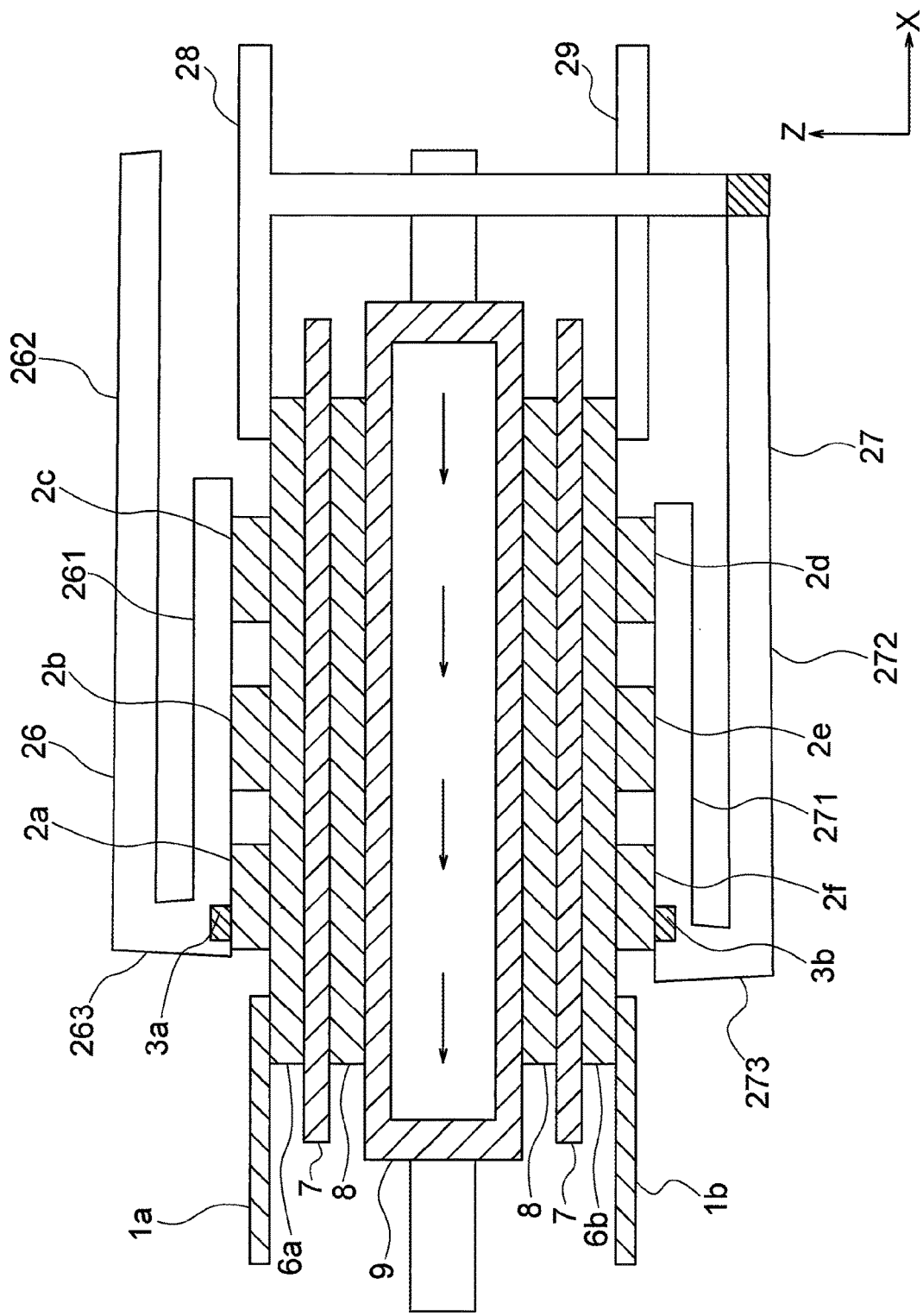
FIG. 13 is a sectional view taken along the line VI-VI of FIG. 12.

Referring to FIG. 12 and FIG. 13, a description is given of a semiconductor power module according to a sixth embodiment of the present invention, which has a different configuration from that in the second embodiment to fifth embodiment. FIG. 12 is a bottom view of the semiconductor power module according to the sixth embodiment of the present invention. FIG. 13 is a sectional view taken along the line VI-VI of FIG. 12. In the sixth embodiment, the description is not given of similar configuration to that in the first embodiment to fifth embodiment, and is mainly given of the different configuration from the first embodiment to fifth embodiment.

The semiconductor power module of the sixth embodiment includes the control terminal 1a (first control terminal), the control terminal 1b (second control terminal), the plurality of semiconductor elements 2, the sensor 3a (first sensor), the sensor 3b (second sensor), the main wiring 26 (first main wiring), a main wiring 27 (second main wiring), a main wiring 28, a main wiring 29, the electrode 6a (first electrode), the electrode 6b (second electrode), the two insulating substrates 7, the two heat sinks 8, the cooler 9 (not shown), and the control board (not shown).

On an upper face of the cooler 9, the electrode 6a on which the plurality of semiconductor elements 2 is mounted, the insulating substrate 7 on which the electrode 6a is mounted, and the heat sink 8 on which the insulating substrate 7 is placed are arranged. On a lower face of the cooler 9, the electrode 6b on which the plurality of semiconductor elements 2 are mounted, the insulating substrate 7 on which the electrode 6b is mounted, and the heat sink 8 on which the insulating substrate 7 is placed are arranged. In this way, the electrode 6a is disposed on the upper face side of the cooler 9, and the electrode 6b is disposed on the lower face side of the cooler 9.

The main wiring 26 is connected to the respective element arrays mounted on the electrode 6a. The main wiring 26 has linear portions 261 (first linear portions) that are connected to the respective element arrays mounted on the electrode 6a, and extend in the X direction, linear portions 262 (second linear portions) extending, in the X direction, oppositely to the linear portions 261, and connection portions 263 formed to connect one ends of the respective linear portions 261 and one ends of the respective linear portions 262.

Another ends of the respective linear portions 262 of the main wiring 26 are connected to the first electronic device. Considering the configuration of FIG. 14, for example, the another ends of the respective linear portions 262 of the main wiring 26 are connected to the N side.

The main wiring 27 is connected to the respective element arrays mounted on the electrode 6b. The main wiring 27 has linear portions 271 (first linear portions) that are connected to the respective element arrays mounted on the electrode 6b, and extend in the X direction, linear portions 272 (second linear portions) extending, in the X direction, oppositely to the linear portions 271, and connection portions 273 formed to connect one ends of the respective linear portions 271 and one ends of the respective linear portions 272. Another ends of the respective linear portions 272 of the main wiring 27 are connected to the electrode 6a.

The main wiring 28 is connected to the electrode 6a, and extends in the X direction, and an end portion thereof is connected to a second electronic device. The main wiring 29 is connected to the electrode 6b, and extends in the X direction, and an end portion thereof is connected to a first electronic device. Considering the configuration of FIG. 14, for example, the end portion of the main wiring 28 is connected to the UVW side, and the end portion of the main wiring 29 is connected to the P side.

As described above, in the semiconductor power module of the sixth embodiment, the electrode 6a (first electrode) is disposed on the upper face side of the cooler 9, and the electrode 6b (second electrode) is disposed on the lower face side of the cooler 9, in contrast to the configuration of the second embodiment. The main wiring 26 (first main wiring) is configured to have the linear portions 261 (first linear portions) that are connected to the respective element arrays mounted on the electrode 6a, and extend in the X direction, the linear portions 262 (second linear portions) extending, in the X direction, oppositely to the linear portions 261, and the connection portions 263 formed to connect one ends of the respective linear portions 261 and one ends of the respective linear portions 262. The main wiring 27 (second main wiring) is configured to have the linear portions 271 (first linear portions) that are connected to the respective element arrays mounted to the electrode 6b, and extend in the X direction, the linear portions 272 (second linear portions) extending, in the X direction, oppositely to the linear portions 271, and the connection portions 273 formed to connect one ends of the respective linear portions 271 and one ends of the respective linear portions 272. This configuration can produce the same effects as those of the first embodiment as well.

REFERENCE SIGNS LIST 1a, 1b control terminal, 2 semiconductor element, 3a, 3b sensor, 4 main wiring, 41, 42 linear portion, 43, 44 connection portion, 45 end portion, 5 main wiring, 6a, 6b electrode, 7 insulating substrate, 8 heat sink, 9 cooler, 10 main wiring, 101 linear portion, 102 end portion, 11 main wiring, 111 linear portion, 112 end portion, 12 main wiring, 121, 122 recess, 123 linear portion, 124, 125 end portion, 13 main wiring, 14 main wiring, 141 linear portion, 142 end portion, 15 main wiring, 151, 152 linear portion, 153 connection portion, 154 recess, 155 end portion, 16, 17 main wiring, 18 main wiring, 181, 182 linear portion, 183 connection portion, 184 end portion, 19 main wiring, 191, 192 linear portion, 193 connection portion, 194 end portion, 20, 21 main wiring, 22 main wiring, 221, 222 linear portion, 223 connection portion, 224 end portion, 23 main wiring, 231 linear portion, 232 end portion, 24, 25 main wiring, 26 main wiring, 261, 262 linear portion, 263 connection portion, 27 main wiring, 271, 272 linear portion, 273 connection portion, 28, 29 main wiring

The invention claimed is:

1. A semiconductor power module comprising:
  a first electrode, on which a plurality of element arrays each including a plurality of semiconductor elements arranged in an X direction are arranged in a Y direction perpendicular to the X direction;
  a first main wiring connected to the respective element arrays mounted on the first electrode;
  a first sensor mounted on a first detection target element, said first detection target element being that one of the semiconductor elements; which is least influenced by synthetic inductance of the first main wiring, among the semiconductor elements of the plurality of element arrays mounted on the first electrode;
  a first control terminal disposed on the first electrode; and
  a control board, which is connected to the first sensor via the first control terminal, and is configured to control a current flowing through the first detection target element based on a detection result of the first sensor obtained via the first control terminal.

2. The semiconductor power module according to claim 1, further comprising a cooler configured to cool the plurality of semiconductor elements, wherein the first detection target element is disposed on a most downstream side of flow of a coolant in the cooler, which flows in the X direction.

3. The semiconductor power module according to claim 1, wherein the first main wiring has:
  first linear portions, which are connected to the respective element arrays mounted on the first electrode, and are extended in the X direction;
  second linear portions, which are extended in the X direction and are opposed to the first linear portions; and
  connection portions configured to connect one ends of the respective first linear portions and one ends of the respective second linear portions, and
  wherein the first detection target element is the semiconductor element at which a wiring length of the first main wiring to an end portion thereof is shortest among the semiconductor elements of the plurality of element arrays.

4. The semiconductor power module according to claim 1, wherein the plurality of element arrays comprise three or more element arrays, and
  wherein a temperature sensor is mounted on the respective semiconductor elements of the element arrays except the element arrays located at end portions.

5. The semiconductor power module according to claim 1, further comprising:
  a second electrode, on which a plurality of element arrays each including a plurality of semiconductor elements arranged in the X direction are arranged in the Y direction;
  a second main wiring connected to the respective element arrays mounted on the second electrode;
  a second sensor mounted on a second detection target element, said second detection target element being that one of the semiconductor elements, which is least influenced by synthetic inductance of the second main wiring, among the semiconductor elements of the plurality of element arrays mounted on the second electrode; and a second control terminal disposed on the second electrode, wherein the control board is connected to the second sensor via the second control terminal, and is configured to control a current flowing through the second detection target element based on a detection result of the second sensor obtained via the second control terminal.

6. The semiconductor power module according to claim 5, further comprising a third main wiring disposed oppositely above the first main wiring and the second main wiring,
wherein an end portion of the third main wiring is connected to the second electrode,
wherein an end portion of the second main wiring is connected to the first electrode,
wherein the first main wiring has linear portions, which are connected to the respective element arrays mounted on the first electrode, and are extended in the X direction,
wherein the second main wiring has linear portions, which are connected to the respective element arrays mounted on the second electrode, and are extended in the X direction,
wherein the third main wiring includes:
a first recess formed oppositely above the first detection target element mounted on the first electrode;
a second recess formed oppositely above the second detection target element mounted on the second electrode; and
a linear portion, which is configured to connect one end of the first recess and one end of the second recess, and is extended in the X direction oppositely to a corresponding one of the linear portions of the first main wiring and a corresponding one of the linear portions of the second main wiring,
wherein a distance between the first recess of the third main wiring and the corresponding one of the linear portions of the first main wiring is smaller than a distance between the linear portion of the third main wiring and the corresponding one of the linear portions of the first main wiring, and
wherein a distance between the second recess of the third main wiring and the corresponding one of the linear portions of the second main wiring is smaller than a distance between the linear portion of the third main wiring and the corresponding one of the linear portions of the second main wiring.

7. The semiconductor power module according to claim 5,
wherein an end portion of the first main wiring is connected to the second electrode,
wherein the first main wiring has linear portions, which are connected to the respective element arrays mounted on the first electrode, and are extended in the X direction,
wherein the second main wiring includes:
first linear portions, which are connected to the respective element arrays mounted on the second electrode, and are extended in the X direction;
second linear portions, which are extended in the X direction oppositely to the first linear portions and the linear portions of the first main wiring;
connection portions configured to connect one ends of the respective first linear portions and one ends of the respective second linear portions; and
a recess, which is connected to another end of a corresponding one of the second linear portions, and is disposed oppositely above the first detection target element mounted on the first electrode, and
wherein a distance between the recess of the second main wiring and a corresponding one of the linear portions of the first main wiring is smaller than a distance between the corresponding one of the second linear portions of the second main wiring and the corresponding one of the linear portions of the first main wiring.

8. The semiconductor power module according to claim 5,
wherein an end portion of the second main wiring is connected to the first electrode,
wherein the first main wiring includes:
first linear portions, which are connected to the respective element arrays mounted on the first electrode, and are extended in the X direction;
second linear portions, which are extended in the X direction oppositely to the first linear portions; and
connection portions configured to connect one ends of the respective first linear portions and one ends of the respective second linear portions, and
wherein the second main wiring includes:
first linear portions, which are connected to the respective element arrays mounted on the second electrode, and are extended in the X direction;
second linear portions which are extended in the X direction oppositely to the first linear portions; and
connection portions configured to connect one ends of the respective first linear portions and one ends of the respective second linear portions.

9. The semiconductor power module according to claim 5,
wherein an end portion of the first main wiring is connected to the second electrode,
wherein the second main wiring has linear portions, which are connected to the respective element arrays mounted on the second electrode, and are extended in the X direction,
wherein the first main wiring has:
first linear portions, which are connected to the respective element arrays mounted on the first electrode, and are extended in the X direction;
second linear portions, which are extended in the X direction oppositely to the linear portions of the second main wiring and the first linear portions; and
connection portions configured to connect one ends of the respective first linear portions and one ends of the respective second linear portions.

10. The semiconductor power module according to claim 5, further comprising a cooler configured to cool the plurality of semiconductor elements,
wherein the first electrode is disposed on an upper face side of the cooler,
wherein the second electrode is disposed on a lower face side of the cooler,
wherein an end portion of the second main wiring is connected to the first electrode,
wherein the first main wiring includes:
first linear portions, which are connected to the respective element arrays mounted on the first electrode, and are extended in the X direction;
second linear portions, which are extended in the X direction oppositely to the first linear portions; and
connection portions configured to connect one ends of the respective first linear portions and one ends of the respective second linear portions, and
wherein the second main wiring includes:

first linear portions, which are connected to the respective element arrays mounted on the second electrode, and are extended in the X direction;

second linear portions, which are extended in the X direction oppositely to the first linear portions; and connection portions configured to connect one ends of the respective first linear portions and one ends of the respective second linear portions.

11. The semiconductor power module according to claim 1, wherein the sensor comprises a temperature sensor or a current sensor.

12. The semiconductor power module according to claim 1, wherein each of the semiconductor elements is made of a wide bandgap semiconductor.

* * * * *